(12) United States Patent
Mino et al.

(10) Patent No.: US 7,749,921 B2
(45) Date of Patent: Jul. 6, 2010

(54) SEMICONDUCTOR ELEMENT, METHOD FOR MANUFACTURING THE SEMICONDUCTOR ELEMENT, ELECTRONIC DEVICE AND METHOD FOR MANUFACTURING THE ELECTRONIC DEVICE

(75) Inventors: Norihisa Mino, Osaka (JP); Takayuki Takeuchi, Osaka (JP); Yasuo Kitaoka, Osaka (JP)

(73) Assignee: Panasonic Corporation, Osaka (JP)

( * ) Notice: Subject to any disclaimer, the term of this patent is extended or adjusted under 35 U.S.C. 154(b) by 62 days.

(21) Appl. No.: 12/303,472

(22) PCT Filed: Jun. 5, 2007

(86) PCT No.: PCT/JP2007/061381

§ 371 (c)(1), (2), (4) Date: Dec. 4, 2008

(87) PCT Pub. No.: WO2007/142238

PCT Pub. Date: Dec. 13, 2007

(65) Prior Publication Data

US 2009/0194763 A1 Aug. 6, 2009

(30) Foreign Application Priority Data

Jun. 7, 2006 (JP) .............................. 2006-159062

(51) Int. Cl.
*H01L 21/31* (2006.01)
*H01L 23/58* (2006.01)

(52) U.S. Cl. ...................... 438/780; 257/642

(58) Field of Classification Search ......... 438/763–765, 438/780, 781; 445/49–51; 257/642, 643, 257/E51.002–E51.052, E25.008–E25.009
See application file for complete search history.

(56) References Cited

U.S. PATENT DOCUMENTS

| 6,107,117 A | 8/2000 | Bao et al. | |
| 6,403,397 B1 * | 6/2002 | Katz | ........................... 438/99 |
| 7,357,690 B2 * | 4/2008 | Tsuruoka et al. | .............. 445/49 |

(Continued)

FOREIGN PATENT DOCUMENTS

JP 10-190001 A 7/1998

(Continued)

OTHER PUBLICATIONS

Nakanishi, H. "Yuuki Kesshou Zairyou no Saishin Gijyutsu" (Recent Advances in Research and Development of Organic Crystalline Materials), CMC Publishing Co., Ltd., Dec. 27, 2005.

(Continued)

*Primary Examiner*—Calvin Lee
(74) *Attorney, Agent, or Firm*—Hamre, Schumann, Mueller & Larson, P.C.

(57) ABSTRACT

A manufacturing method of a semiconductor element provided with a semiconductor layer containing a crystal of an organic semiconductor material of the invention includes the steps of (i) forming a frame (12) on a substrate (base) (11), and (ii) forming the semiconductor layer (crystal (13)) inside the frame (12). The step (ii) includes a crystal forming step in which a solution (21) containing the organic semiconductor material and a liquid medium is placed inside the frame (12) and then the crystal (13) is formed from the solution (21).

27 Claims, 8 Drawing Sheets

U.S. PATENT DOCUMENTS

| | | |
|---|---|---|
| 2003/0059984 A1 | 3/2003 | Sirringhaus et al. |
| 2004/0201048 A1 | 10/2004 | Seki et al. |
| 2005/0045885 A1 | 3/2005 | Kim et al. |
| 2006/0008956 A1 | 1/2006 | Yudasaka et al. |
| 2008/0303029 A1* | 12/2008 | Kawashima et al. .......... 257/72 |

FOREIGN PATENT DOCUMENTS

| | | |
|---|---|---|
| JP | 2000-353594 A | 12/2000 |
| JP | 2003-518332 A | 6/2003 |
| JP | 2003-286100 A | 10/2003 |
| JP | 2004-111872 A | 4/2004 |
| JP | 2005-079598 A | 3/2005 |
| JP | 2005-081299 A | 3/2005 |
| JP | 2005-099004 A | 4/2005 |
| JP | 2005-294571 A | 10/2005 |
| JP | 2006-049810 A | 2/2006 |
| JP | 2006-060079 A | 3/2006 |

OTHER PUBLICATIONS

Takeya, J. et al. "Field-induced charge transport at the surface of pentacene single crystals: A method to study charge dynamics of two-dimensional electron systems in organic crystals", Journal of Applied Physics, vol. 94, No. 9, pp. 5800-5804, Nov. 1, 2003.

Yamamoto, H.M. et al. "Direct Formation of Micro-/Nanocrystalline 2,5-Dimethyl $N,N'$—dicyanoquinonediimine Complexes on $SiO_2$/Si Substrates and Multiprobe Measurement of Conduction Properties", Journal of American Chemical Society, vol. 128, pp. 700-701, 2006.

Mino, N. et al. "Fabrication of self-assembled monolayer patterns by selective electron beam irradiation and a chemical adsorption technique", Thin Solid Films, vol. 243, pp. 374-377, 1994.

Briseno, A.L. et al. "Patterned Growth of Large Oriented Organic Semiconductor Single Crystals on Self-Assembled Monolayer Templates", Journal of American Chemical Society, vol. 127, pp. 12164-12165, 2005.

* cited by examiner

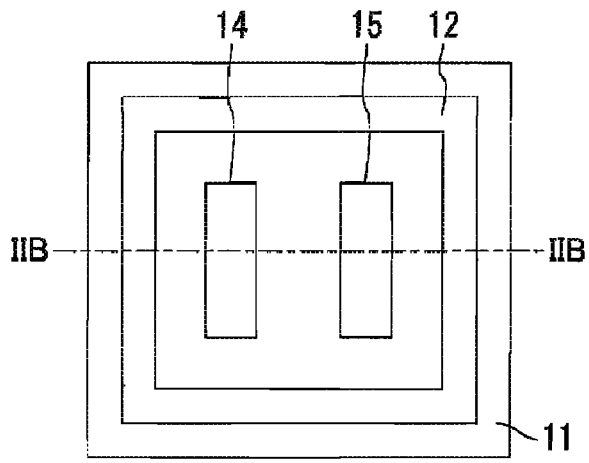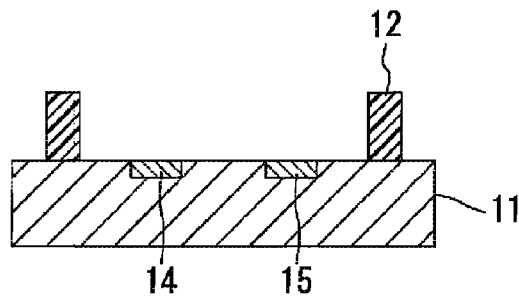
Fig. 2A  Fig. 2B
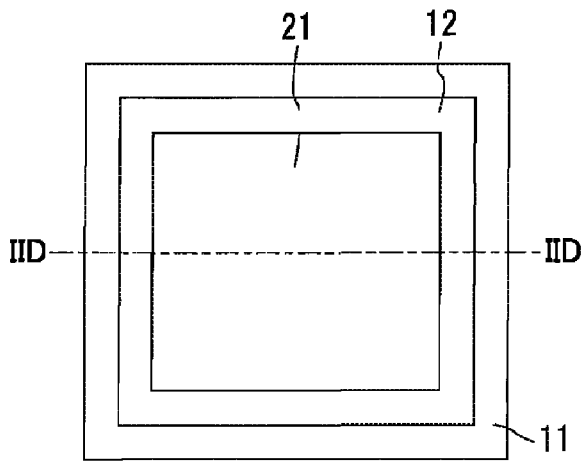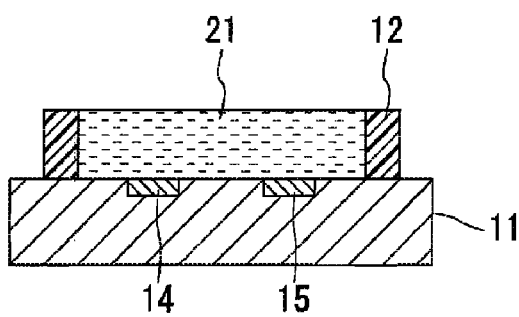
Fig. 2C  Fig. 2D
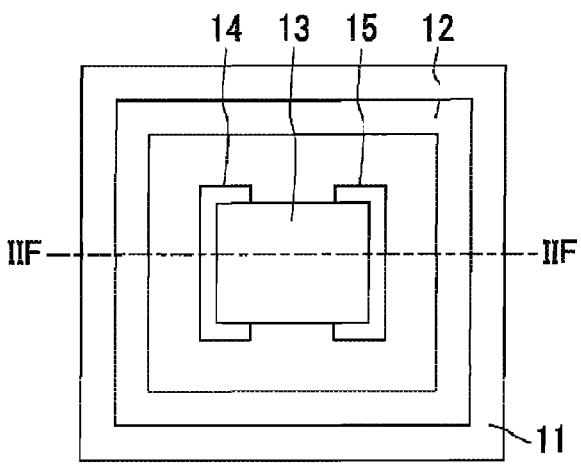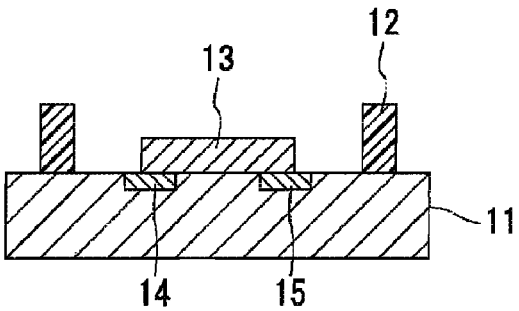
Fig. 2E  Fig. 2F

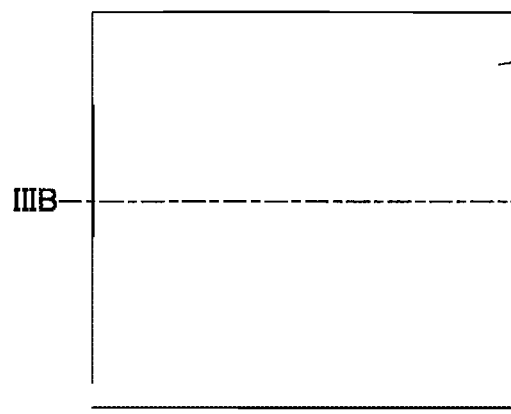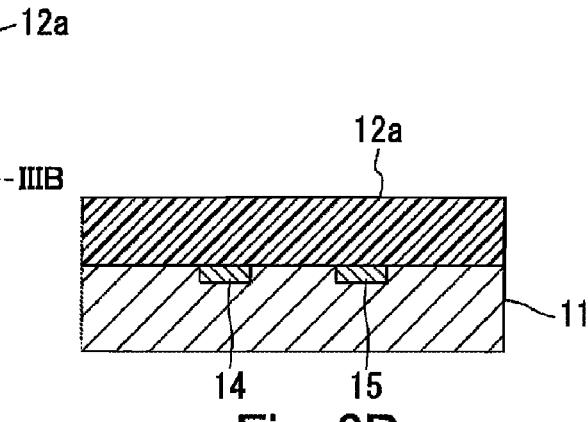
Fig. 3A     Fig. 3B
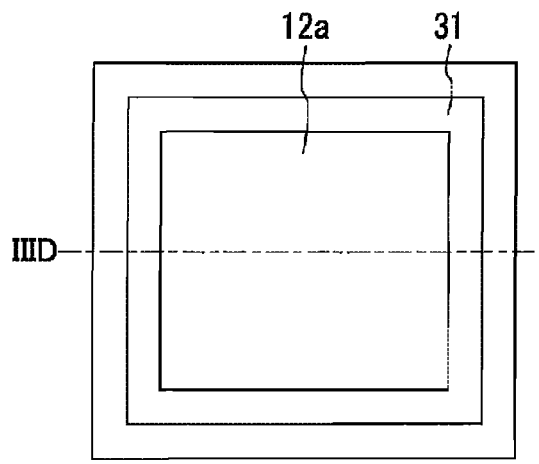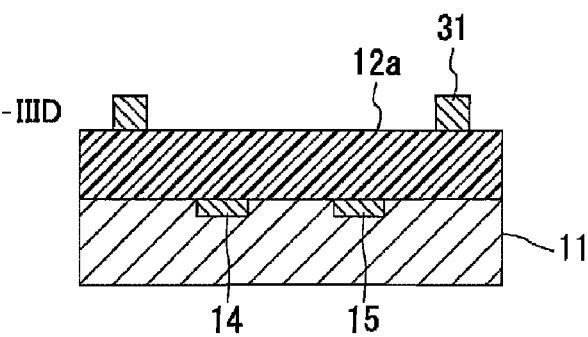
Fig. 3C     Fig. 3D
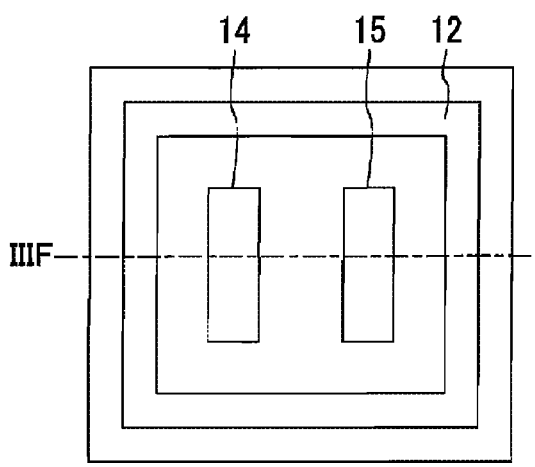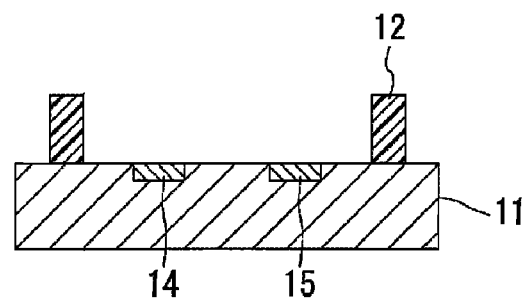
Fig. 3E     Fig. 3F

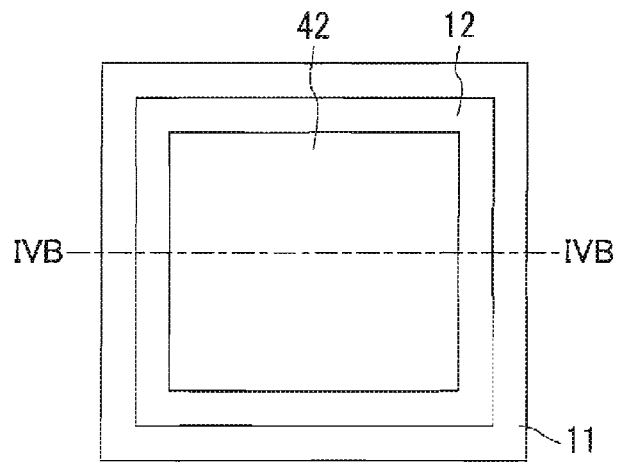
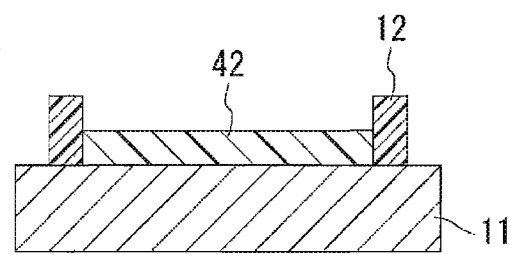
Fig. 4A                Fig. 4B
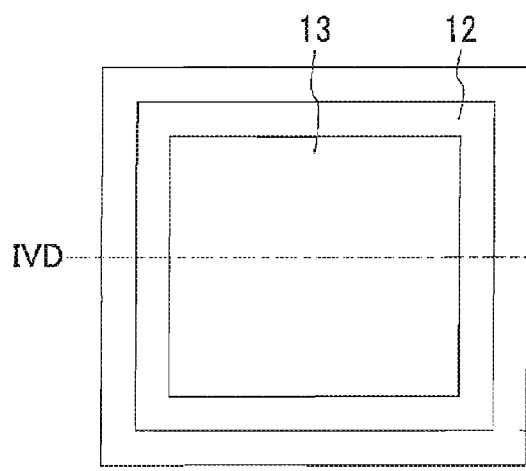
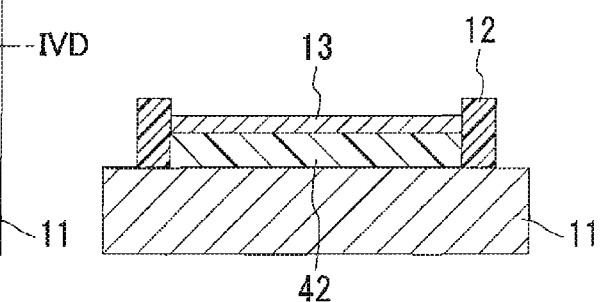
Fig. 4C                Fig. 4D

US 7,749,921 B2

SEMICONDUCTOR ELEMENT, METHOD FOR MANUFACTURING THE SEMICONDUCTOR ELEMENT, ELECTRONIC DEVICE AND METHOD FOR MANUFACTURING THE ELECTRONIC DEVICE

TECHNICAL FIELD

The present invention relates to a semiconductor element, a method for manufacturing the semiconductor element, an electronic device, and a method for manufacturing the electronic device.

BACKGROUND ART

Crystals have unique properties and often show superior characteristics. Accordingly, various elements using an organic crystal material have been proposed (under the editorship of Hachirou Nakanishi, *Yuuki Kesshou Zairyou no Saishin Gijyutsu*, CMC Publishing Co., Ltd., Japan, 2005). Meanwhile, various methods for manufacturing an organic semiconductor material have been proposed (see, for example, JP-A-10-190001). Nevertheless, semiconductor elements using a crystal made of an organic semiconductor material have not been studied extensively.

Only recently has a method by which a single crystal of pentacene is formed so as to form a semiconductor element by using a flake of the single crystal been proposed (J. Takeya, "Field induced-Charge Transport at the Surface of Pentacene Single Crystals: A Method to Study Charge Dynamics of Two-Dimensional Electron Systems in Organic Crystals", *Journal of Applied Physics*, Vol. 94, page. 5800, 2003). This method, however, has a problem that the mass productivity is poor.

Also, Yamamoto has proposed a method for growing a single crystal of organic molecules on a silicon substrate through a chemical reaction by immersing a silicon substrate incorporating copper or silver electrodes in a solution of dicyanoquinonediimine (Hiroshi M. Yamamoto, "Direct Formation of Micro-/Nanocrystalline 2,5-Dimethyl-N,N-dicyanoquinonediimine Complexes on $SiO_2$/Si substrates and Multiprobe Measurement of Conduction Properties", *Journal of American Chemical Society*, Vol. 128, Issue 3, page 700, 2006).

However, as is shown in FIG. 3 of the article by Yamamoto cited above, the method described in the cited article fails to control a position at which a crystal is to be formed. It is therefore difficult to make this method available for industrial applications.

DISCLOSURE OF THE INVENTION

In view of the foregoing, an object of the invention is to provide a manufacturing method for manufacturing a semiconductor element using a crystal made of an organic semiconductor material as an industrially available manufacturing method. Another object of the invention is to provide a semiconductor element using a crystal made of an organic semiconductor material as a semiconductor element with superior characteristics. Still another object of the invention is to provide a method for manufacturing an electronic device using the manufacturing method described above and to provide an electronic device using the semiconductor element described above.

In order to achieve the above and other objects, a method of the present invention for manufacturing a semiconductor element provided with a semiconductor layer containing a crystal of an organic semiconductor material includes the steps of (i) forming a frame on a base; and (ii) forming the semiconductor layer inside the frame, wherein the step (ii) includes a crystal forming step in which a liquid containing the organic semiconductor material and a liquid medium is placed inside the frame and then the crystal is formed from the liquid.

A method of the present invention for manufacturing an electronic device provided with a semiconductor element includes a step of manufacturing the semiconductor element by the manufacturing method of the present invention.

According to one aspect, a semiconductor element of the invention is the semiconductor element manufactured by the manufacturing method of the present invention.

A semiconductor element of the present invention includes a base, a frame disposed on the base, and a semiconductor layer disposed inside the frame, and the semiconductor layer contains a crystal of an organic semiconductor material. The organic semiconductor material referred to herein means an organic material showing the characteristics of a semiconductor.

Also, an electronic device of the invention is provided with the semiconductor element of the present invention.

In the present description, unless otherwise specified, the term, "liquid repellency", means a property to repel a liquid (A) described below, and it means the property of a surface on which a static contact angle of the liquid (A) is larger than 91° (typically, 100°). Also, the term, "a lyophilic property", means the property of a surface on which a static contact angle of the liquid (A) described below is 89° (typically, 20°) or smaller. In a case where the liquid medium in the liquid is water, the liquid repellency and the lyophilic property are rephrased as water repellency and a hydrophilic property, respectively.

According to the manufacturing method of the invention, it is possible to form a semiconductor layer containing a crystal made of an organic semiconductor material at a desired position on the base. According to the manufacturing method of the invention, because the crystal is formed on the base, the manufacturing process is simple. In addition, because nearly all of the formed crystal can be used effectively, only a small amount of materials is sufficient to form the crystal. It thus becomes possible to produce a semiconductor element using a crystal made of an organic semiconductor material industrially at low costs.

BRIEF DESCRIPTION OF THE DRAWINGS

FIGS. 2A through 2F are views showing an example of a method of the invention for fabricating a FET.

FIGS. 3A through 3F are views showing a part of the steps in the fabrication method shown in FIG. 2.

FIGS. 4A and 4B are respectively a top view and an end view showing another step in the method of the invention for fabricating a FET.

FIGS. 4C and 4D are respectively a top view and a cross section showing still another step.

BEST MODE FOR CARRYING OUT THE INVENTION

Figures 1A, 1B:
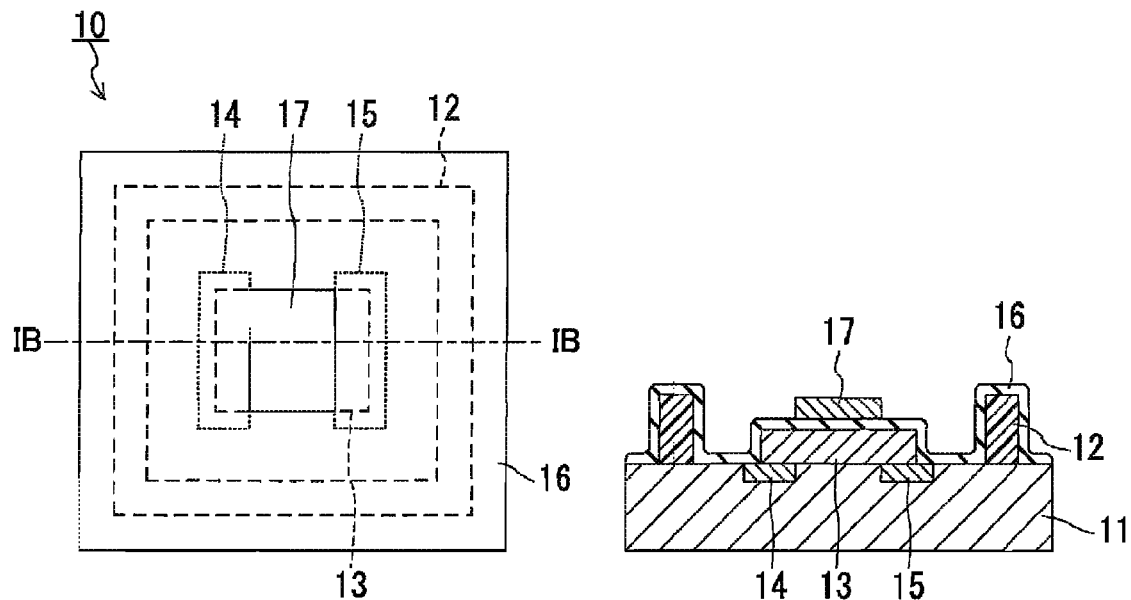
FIGS. 1A and 1B are respectively a top view and a cross section showing an example of a field effect transistor (FET) of the invention.

Hereinafter, embodiments of the invention will be described. The invention is, however, not limited to the descriptions of embodiments and examples below. In the following descriptions, particular numerical values and particular materials will be specified by way of example. It is, however, possible to use other numerical values and other materials as long as the effects of the invention can be achieved.

[Manufacturing Method of Semiconductor Element]

A method of the invention for manufacturing a semiconductor element is a manufacturing method of a semiconductor element provided with a semiconductor layer containing a crystal of an organic semiconductor material. This manufacturing method includes a step (i) and a step (ii) as follows.

In the step (i), a frame is formed on a base. In the step (ii), a semiconductor layer is formed inside the frame. The step (ii) includes a crystal forming step in which a liquid (hereinafter, occasionally referred to as the liquid (A)) containing the organic semiconductor material and a liquid medium is placed inside the frame and then the crystal is formed from the liquid.

The base used in the step (i) may be a substrate or it may be composed of a substrate and a layer (film) formed on the substrate. In either case, the frame is formed directly or indirectly on the substrate. A substrate that has been typically used as a substrate in a semiconductor element can be used as the substrate (the base). Examples of a material of the substrate include glass, quartz, ceramics (such as aluminum oxide, magnesium oxide and mica), metals (such as aluminum, stainless, copper, and iron), resin, silicon, or a composite material chiefly made of the foregoing materials. Examples of resin that can be used as a material of the substrate include a thermoplastic elastomer such as polyimide, polyaramid, epoxy resin, polyethylene naphthalate (PEN), polyether sulfone (PES), polyethylene terephthalate (PET), polyethylene, polypropylene, polycarbonate, polyamide resin (nylon 6, nylon 46, nylon 66, nylon 6-12 and so forth), polyphenylene oxide, polyphenylene sulfide, polymethyl methacrylate, polyether, polyacetal, styrene resin, polyolefin resin, polyvinyl chloride resin, polyurethane resin, polyester resin, and polybutadiene resin, or a copolymer, a blend, or a polymer alloy chiefly made of the foregoing resins. A mixture of two or more types of the foregoing resins may be used as well. The base may be made of resin.

The base may have flexibility. A printed circuit board suitable for a flexible electronic device can be formed using a base having flexibility. In addition, the base may have translucency in a wavelength region of visible light. Such a base can be used as a panel of a display device.

One or more frames can be formed on the base. In a case where more than one semiconductor element is to be formed on a single base, more than one frame is formed on the base and a semiconductor layer containing a crystal is formed inside each frame.

Any type of frame is available as long as it can hold the liquid (A) inside the frame in the step (ii). By using the frame, it becomes possible to form a crystal of an organic semiconductor material from a small amount of materials at a predetermined position.

The frame, however, has to be resistant to the liquid (A). Also, the frame has to withstand conditions under which a crystal is formed (for example, a temperature change). A material of the frame can be either an organic material or an inorganic material as long as it has the properties as specified above. For example, the frame may be a film made of an organic compound such as a self-assembled film. The self-assembled film referred to herein is defined as a film that is formed spontaneously in order from a material of the film by its own mechanism in a state where no detailed control is applied from the outside. Such a film includes an organized ultra-thin film having a certain order (a monomolecular film and an LB film). Examples of the self-assembled film will be specified below. Alternatively, the frame may be formed of a film other than the self-assembled film, for example, a photoresist film. Also, the frame may be formed by depositing an organic thin film by performing spin coating or bar coating first and then patterning the organic thin film using the photolithography. Further, the frame may be an organic film formed by means of printing such as gravure printing, intaglio printing, lithographic printing, relief printing, and screen printing, as well as by means of the dispenser method, the ink-jet method, mask vapor deposition, roll coating, and so forth.

The frame has a closed shape. The planar shape (the sectional shape in a direction parallel to the surface of the substrate) inside the frame is not particularly limited and the planar shape may be a circle or a polygon such as a triangle and a square.

The planar shape inside the frame may be of a size small enough to fit inside a circle having a diameter of 0.5 µm to 2000 µm (for example, 0.5 µm to 1000 µm or 10 µm to 100 µm). The area of the planar shape inside the frame may be, for example, in the range of 0.75 µm² (µm×µm) to $3 \times 10^6$ µm² or in the range of 300 µm² to 30000 µm². The frame can be of any reasonable height as long as it is high enough to hold the liquid (A) inside. The height of the frame is normally almost constant. The height of the frame may be, for example, in the range of 0.1 nm to 10 µm or in the range of 1.0 nm to 3.0 nm. An inner volume of the frame (the product of the area of the bottom surface enclosed by the frame and the height of the frame) may be, for example, in the range of $7.5 \times 10^{-5}$ µm³ (µm×µm×µm) to $3 \times 10^7$ µm³ or in the range of 0.3 µm³ to 90000 µm³.

The frame may be formed so as to cover the surface of the base either mostly or entirely except for a region where the liquid (A) is to be placed. Alternatively, the frame may be formed only in the periphery of the region where the liquid (A) is to be placed.

The frame may be liquid repellent either partially or entirely. To be more concrete, it is possible to use a frame made of a material on which a static contact angle of the liquid (A) is 91° or greater. For example, in a case where the liquid (A) contains water, the frame may have a hydrophobic surface. Such a hydrophobic surface can be, for example, a surface made of an organic compound containing a fluorocarbon group. By using the frame that repels the liquid (A), it becomes possible in some cases to suppress overflow of the liquid (A) from the frame.

In a case where the frame is a self-assembled film, a preferable example of a material of the frame is an organic compound containing at least a single functional group selected from the group consisting of a halogenosilane group, an alkoxysilane group, a multidentate functional group, a thiol group, an unsaturated bond group, and a sulfonate group. The foregoing functional groups form highly durable bonding with the base. In a case where an active hydrogen group exists in the surface of the base, a halogenosilane group, an alkoxysilane group and an unsaturated bond group are effective. In a case where metal exists in the surface of the base, a thiol group and a multidentate functional group are effective.

In a case where the frame is a self-assembled film, another preferable example of a material of the frame is an organic compound containing a straight-chain molecular structure (for example, a hydrocarbon chain). A type of the straight-chain molecular structure is selected according to a type of the liquid (A) used in forming the semiconductor layer. Alternatively, a type of the straight-chain molecular structure may be selected on the basis of a solubility parameter (SP value). By modifying the frame with a functional group having an SP value close to the SP value of the liquid (A), it becomes possible to form a frame that is easy to wet with the liquid (A). Conversely, by modifying the frame with a functional group having an SP value that differs markedly from the SP value of the liquid (A), it becomes possible to form a frame that repels the liquid (A). A silane coupling agent used in a first embodiment below is an organic compound that forms a self-assembled film. This silane coupling agent contains a halogenosilane group (chlorosilane group) and it has 10 carbons and a fluorocarbon chain alone. The SP value of this silane coupling agent is about 6, which is extremely small. It thus becomes possible to form a frame that repels the liquid (A) by using this silane coupling agent.

In a case where the frame is a self-assembled film, the length of a molecule forming the self-assembled film is related to the height of the frame. In a case where the principal chain of a molecule forming a self-assembled film has 3 to 30 carbons, the self-assembled film can be formed readily.

The step (i) may include the steps of (i-a) forming a resist pattern on the base, (i-b) forming a self-assembled film so as to cover the resist pattern, and (i-c) forming a frame formed of the self-assembled film by removing the resist pattern.

Alternatively, the step (i) may include the steps of (i-A) forming a self-assembled film on the base, and (i-B) forming a frame formed of the self-assembled film by removing a part of the self-assembled film. The step (i-B) may include a step of decomposing the part of the self-assembled film by irradiating a UV ray or an electron beam to the part of the self-assembled film. The part of the self-assembled film may be decomposed by other methods. For example, ozone may be produced by irradiating a UV ray on the part of the self-assembled film under atmosphere containing an oxygen gas for causing part of the self-assembled film to undergo oxidative decomposition.

Further, the step (i) may include a step of making a pattern, for forming the frame, on a printing plate; a step of placing a material of a self-assembled film on the pattern; and a step of forming the frame formed of the self-assembled film by pressing the printing plate against the base. The printing plate referred to herein is a plate used in relief printing, intaglio printing, lithographic printing, or screen printing.

In the step (ii), the semiconductor layer is formed inside the frame. The semiconductor layer contains a crystal of the organic semiconductor material. The crystal may be a single crystal, a polycrystal, a molecular crystal (a crystal formed by a van der Waals' force), or a mixture of the foregoing crystals. The semiconductor layer may include an organic semiconductor material in a state (amorphous or microcrystal) other than the foregoing crystals. It is, however, preferable that the foregoing crystals account for a higher proportion of the semiconductor layer, and in particular, it is preferable that a single crystal accounts for a higher proportion of the semiconductor layer. A semiconductor layer made of crystals (preferably, a single crystal) alone is a preferable example. A crystal (preferably, a single crystal and a microcrystal is excluded) of the organic semiconductor material accounts for, for example, at least 50% by volume, and preferably at least 70% by volume of the total of the semiconductor layer.

The semiconductor layer and a crystal forming the semiconductor layer have a volume, for example, of 0.5 $\mu m^3$ or greater, and preferably they have a volume of 5 $\mu m^3$ or greater. It is normal that a volume of the semiconductor layer and a crystal forming the semiconductor layer is equal to or smaller than an inner volume of the frame. It should be noted, however, that in a case where a frame that repels a liquid is used, the liquid can be placed so as to swell inside the frame. It is therefore possible to obtain a crystal having a volume equal to or greater than the inner volume of the frame. In a case where a crystal is made up of a plurality of crystal grains, a single crystal grain has a volume, for example, of 0.05 $\mu m^3$ or greater, and more preferably, it has a volume of 0.5 $\mu m^3$ or greater.

A height of the semiconductor layer and a crystal forming the semiconductor layer may be, for example, in the range of 10 nm to 10 $\mu m$. The height, however, may be less than 10 nm or more than 10 $\mu m$ as long as the effects of the invention can be achieved.

The semiconductor layer typically is made of an organic semiconductor material. It should be noted, however, that the semiconductor layer may contain a substance other than the organic semiconductor material as long as the effects of the invention can be achieved. For example, the organic semiconductor material may account for at least 50% by mass of the total of the semiconductor layer, or it may account for at least 80% by mass or at least 90% by mass of the total.

The organic semiconductor material is an organic compound from which the liquid (A) can be prepared by dispersing or dissolving the organic compound in a liquid medium, and it is also an organic compound from the liquid (A) of which a crystal can be formed. Further, the organic semiconductor material is an organic compound at least a crystal of which shows a property as a semiconductor. The organic compound may have a molecular weight of smaller than 5000 or a molecular weight of 5000 or greater. Examples of the organic semiconductor material include an aromatic hydrocarbon compound, a polycyclic compound (condensed-ring compound), and a pendant compound containing the foregoing compounds as a pendant. The organic semiconductor material may be an organic molecule containing a conjugate double bond in the principal chain.

Examples of the organic semiconductor material include a condensed polycyclic aromatic hydrocarbon (such as rubrene, anthracene, hexacene, tetracene, pyrene, naphthacene, perylene, coronene, phenanthrene and pentacene) and a derivative of the foregoing polycyclic aromatic hydrocarbons. Examples also include porphyrin, fullerene and a fullerene derivative, a thiophene derivative and oligothiophene, a pyrrole derivative and oligopyrrole, a thiophenephenylene oligomer, and phenylenevinylene and a derivative thereof. Examples also include a merocyanine compound, a phthalocyanine compound, a quinacridone compound, and a para-sexiphenyl compound. Examples also include a charge-transfer complex of tetrathiafulvalene-tetracyanoxydimethane (for example, bisethylene dithiotetrathiafulvalene-difluorotetracyanoxydimethane, and dibenzotetrathiafulvalene-tetracyanoxydimethane).

Examples also include a triphenylamine compound. Examples also include a benzidine derivative, an oxadiazole derivative, a triazole derivative, a bisstyrlbenzene derivative, an aluminumquinoline complex, a quinolinol complex and a derivative thereof, a styrylamine derivative, a coumarin derivative, a phenylpyridine complex and a derivative thereof, and carbazole and a derivative thereof. Examples also include chain silanes (octa-silane, hexa-silane, and penta-silane) and cyclic silanes (cycloocta-silane, cyclohexa-silane, and cyclopenta-silane). Examples also include a pigment (phthalocyanines, porphyrins, and a condensed-ring compound).

The liquid medium in the liquid (A) is selected taking into consideration the organic semiconductor material, the material of the frame, the characteristics of the bottom surface enclosed by the frame, and so forth. Examples of the liquid medium in the liquid (A) include water, an organic solvent, and a mixed liquid of water and an organic solvent.

One example of the liquid (A) is a solution prepared by dissolving rubrene in 1,2,4-trichlorobenzene. Another example of the liquid (A) is a solution prepared by dissolving a condensed polycyclic aromatic compound (such as pentacene, rubrene, hexacene and tetracene) or a derivative thereof in an organic solvent. The organic solvent may be hydrocarbon such as aromatic hydrocarbon, aliphatic hydrocarbon, aromatic halogenated hydrocarbon, and aliphatic halogenated hydrocarbon. Examples of aromatic halogenated hydrocarbon include chlorobenzene, bromobenzene, iodobenzene, fluorobenzene, dichlorobenzene, dibromobenzene, diiodobenzene, difluorobenzene, trichlorobenzene, chlorotoluene, bromotoluene, iodotoluene, dichlorotoluene, dibromotoluene, difluorotoluene, chloroxylene, bromoxylene, iodoxylene, chloroethylbenzene, bromoethylbenzene, iodoethylbenzene, dichloroethylbenzene, dibromoethylbenzene, chloronaphthalene, bromonaphthalene, dichloronaphthalene, dichloroanthracene, tetrachlorobenzene, tribromobenzene, and tetrabromobenzene. Examples of aliphatic halogenated hydrocarbon include dichloromethane, dichloroethane, trichloroethane, difluoroethane, tetrachloroethane, tetrafluoroethane, fluorochloroethane, chloropropane, dichloropropane, chloropentane, chlorohexane, and chlorocyclopentane. Examples of aromatic hydrocarbon include toluene, xylene, methylene, and methylnaphthalene. Examples of aliphatic hydrocarbon include decahydronaphthalene, octane, nonane, decane, undecane, dodecane, cycloheptane, and dibutylphthalate. Further, ethers such as diphenylether, carbonate such as propylene carbonate, esters (butyl lactone, propiolactone, diethyl sebacate, and so forth), ketones (cyclohexanone, methylisobutylketone, and so forth), acetonitrile, and tetrahydrofuran may be used as the organic solvent. A mixture of the foregoing solvents may be used as well.

Among the organic solvents specified above, aromatic halogenated hydrocarbon is advantageous in that the solubility of the condensed polycyclic aromatic compound is so high that a formed thin film has superior characteristics.

In the crystal forming step, the liquid (A) may be placed inside the frame by using a discharge device. Examples of the discharge device include a printer head used in an ink-jet printer, and a dispenser device. A predetermined amount of the liquid (A) can be placed readily inside the frame by using such a discharge device.

The liquid (A), however, may be placed inside the frame by other methods. For example, in a case where the surface of the base is almost entirely covered with the frame except for a region where the liquid (A) is to be placed, the liquid (A) may be placed inside the frame by bringing the liquid (A) into contact with the base on which the frame is formed. For example, the base on which is formed the frame may be immersed in the liquid (A) and pulled out later.

In the crystal forming step, a crystal of the organic semiconductor material may be formed by evaporating the liquid medium in the liquid (A). Alternatively, a crystal may be formed from the liquid (A) by controlling one or two or more conditions among a concentration of the organic semiconductor material in the liquid (A), a temperature of the liquid (A), and a pressure of atmosphere. For example, a crystal may be formed from the liquid (A) by cooling the liquid (A). Further, the liquid (A) may be prepared in a state where it is oversaturated with the organic semiconductor material so that a crystal is formed from the liquid (A) in such a state.

In the crystal forming step, in order to accelerate the crystal formation, a treatment to change a state of a part of the liquid (A) may be performed. For example, in the crystal forming step, a substance may be placed inside the frame before the liquid is placed inside the frame, and the substance accelerates formation of the crystal. Also, the crystal forming step may include a step of forming a seed crystal in the liquid (A) by irradiating light (for example, a laser beam or an energy line such as a radial ray) to the liquid (A) placed inside the frame.

In the crystal forming step, the liquid (A) is placed on the bottom surface enclosed by the frame. Hence, the physical properties of the frame and the physical properties of the bottom surface enclosed by the frame possibly may influence the crystal formation. The crystal formation therefore can be controlled in some cases by controlling the physical properties of the frame and the physical properties of the bottom surface enclosed by the frame.

In the manufacturing method of the invention, the bottom surface enclosed by the frame may be lyophilic. The bottom surface is formed of a lyophilic film or the surface of the base to which a lyophilic treatment has been applied. In a case where the liquid (A) is water or a liquid containing water, the bottom surface is formed of a water repellent film or a water repellent surface of the base. In a case where the normal surface of the base is not water repellent, a water repellent treatment may be applied to the surface of the base. Conversely, the bottom surface enclosed by the frame may be liquid repellent.

In the manufacturing method of the invention, affinity (wettability) of the liquid (A) with the bottom surface enclosed by the frame may be higher than affinity of the liquid (A) with the frame. To be more concrete, a static contact angle of the liquid (A) on the bottom surface may be smaller than a static contact angle of the liquid (A) on the frame. When configured in this manner, it is possible to prevent a crystal of the organic semiconductor material from being formed only in the vicinity of the frame. Also, in a case where a frame for which the liquid (A) has low affinity is used, that is, a frame has repelling the liquid (A) is used, it is possible to place the liquid (A) so as to swell inside the frame, which makes it possible to place a larger amount of the liquid (A) inside the frame. Conversely, in the manufacturing method of the invention, affinity of the liquid (A) for the bottom surface enclosed by the frame may be equal to or lower than affinity of the liquid (A) for the frame.

In the manufacturing method of the invention, the liquid medium in the liquid (A) may contain water whereas the frame may be hydrophobic. In a case where the liquid medium is water or a mixed liquid containing water, it is possible, by using a hydrophobic frame, to prevent a crystal of the organic semiconductor material from being formed only in the vicinity of the frame. It also becomes possible to place a larger amount of the liquid (A) inside the frame.

In the manufacturing method of the invention, a self-assembled film made of a fluorocarbon compound formed on a roughened surface may be provided on the bottom surface enclosed by the frame. A fluorocarbon compound used herein is a compound containing a fluorocarbon group and having the self-assembling property. By using such a compound, it becomes possible to form a bottom surface showing ultra liquid repellency. Concrete examples of the fluorocarbon compound will be specified below. The roughened surface may be the substrate surface or the surface of a layer disposed between the substrate and the self-assembled film made of the fluorocarbon compound. The roughened surface has a center line average roughness of 100 nm or less and has the maximum height of 1 µm or less. The sectional area of a single convex portion is 300 $nm^2$ in one example and the area of the convex portion accounts for 50% of the total per unit area in one example.

A first region and a second region having higher affinity for the liquid (A) than the first region may be present in the bottom surface enclosed by the frame. In a preferable example, the first region is liquid repellent and the second region is lyophilic. According to this configuration, it is possible to form a crystal of the organic semiconductor material in the second region and in the vicinity thereof. For example, by forming the second region only at the center portion of the bottom surface enclosed by the frame, it becomes possible to form a crystal of the organic semiconductor material at the center portion alone. One or more second regions may be formed inside a single frame. The first region is formed of a liquid repellent film or a liquid repellent surface of the base. The second region is formed of a lyophilic film or a lyophilic surface of the base. In a case where the liquid (A) is water or a liquid containing water, the first region is formed of a water repellent film or a water repellent surface of the base, whereas the second region is formed of a hydrophilic film or a hydrophilic surface of the base. Liquid repellency (water repellency) and a lyophilic property (hydrophilic property) of the surface of the base may be controlled by the surface treatment.

In the invention, a source electrode and a drain electrode may be disposed in a part of the bottom surface enclosed by the frame. In this case, the second region may be present between the source electrode and the drain electrode. According to this configuration, by adjusting the positions of the source electrode, the drain electrode, and the second region as well as the size of a crystal to be formed, it is possible to form a crystal of the organic semiconductor material so as to be in contact with both the source electrode and the drain electrode.

Also, a gate electrode may be disposed on the bottom surface enclosed by the frame. In this case, the second region may be formed on the gate electrode.

Alternatively, it may be configured in such a manner that the source electrode and the drain electrode are disposed in a part of the bottom surface enclosed by the frame while the gate electrode is disposed between the source electrode and the drain electrode. In this case, the second region may be formed on the gate electrode between the source electrode and the drain electrode.

Further, it may be configured in such a manner that one of the source electrode and the drain electrode is formed in the bottom surface enclosed by the frame while the second region is formed on this one electrode. This configuration can be applied to a longitudinal field effect transistor.

The crystal forming step may be performed in inert gas atmosphere. An example of an inert gas includes a nitrogen gas.

The semiconductor element manufactured by the manufacturing method of the invention may be a field effect transistor (FET). In this case, the semiconductor element may include a gate electrode to apply a voltage to the semiconductor layer, a gate insulating film disposed between the semiconductor layer and the gate electrode, and a source electrode and a drain electrode both in contact with the semiconductor layer.

The FET may be a longitudinal type. In this case, the source electrode and the drain electrode are stacked on the base with the semiconductor layer in between. For example, the source electrode, the semiconductor layer, and the drain electrode may be stacked sequentially in this order from the base side. Conversely, they may be stacked sequentially in order of the drain electrode, the semiconductor layer, and the source electrode from the base side.

The semiconductor element of the invention and the semiconductor element manufactured by the manufacturing method of the invention may be a semiconductor element other than a FET, and for example, it may be a laser element, a diode, a light receiving element, a light emitting element, a thin-film transistor, a ring oscillator, or a dynamic sensor (a pressure sensor or a strain sensor). Also, it may be an element having a Schottky junction structure or an element having a tunnel junction structure. Further, it may be a chemical sensor using the foregoing elements. In the foregoing elements represented by a FET, the configuration and the material same as those of a known element can be applied to the portions except for the semiconductor layer and these portions can be formed by a known method. The forming order of the respective portions is determined according to the structure of the element.

The manufacturing method of the invention further may include a step of removing the frame after the step (ii). The frame is removed by a method suitable for the material of the frame. For example, the frame may be removed by dissolving it in an organic solvent or it may be removed by means of oxidation or decomposition. The frame may be removed after a protection layer is formed on the semiconductor layer. By forming the protection layer, it becomes possible to prevent the semiconductor layer from being removed together with the frame.

Semiconductor Element

From one viewpoint, the semiconductor element of the invention is a semiconductor element manufactured by the manufacturing method of the invention for manufacturing a semiconductor element. It should be noted, however, that the semiconductor element manufactured by the manufacturing method including the frame removing step has no frame when completed. In this case, a trace of the frame possibly may remain in the semiconductor element.

From another viewpoint, the semiconductor element of the invention includes a base, a frame disposed on the base, and a semiconductor layer disposed inside the frame, and the semiconductor layer contains a crystal of an organic semiconductor material. The semiconductor element is manufactured by the manufacturing method of the invention. Because the components of the semiconductor element, for example, the substrate, the base, the frame, the semiconductor layer, a crystal of the organic semiconductor material, and the electrodes, have been described above, descriptions will not be repeated where appropriate. Examples of materials of the foregoing components will be specified below.

The semiconductor layer is disposed on the bottom surface enclosed by the frame. As has been described above, however, a liquid repellent coating layer or a lyophilic coating layer may be formed inside the frame.

Because the semiconductor element of the invention includes the frame, it is possible to prevent short circuit between elements when more than one semiconductor element is formed on the base. In addition, the frame can be used also as a frame to surround the periphery of the gate insulating layer, a frame to surround the periphery of the gate electrode, and a frame to surround the periphery of a light emitting layer in an organic EL element.

In the semiconductor element of the invention, the semiconductor layer may have a curved plane on the side opposite to the base side. By providing the semiconductor element with such a semiconductor layer, it becomes possible to make allowance for the crystalline orientation. Hardly any limitations thus are hardly imposed on the performance of the semiconductor layer, which makes the performance of the element highly likely to be enhanced. The semiconductor layer formed by the manufacturing method of the invention may have a curved plane on the surface due to the influences of the surface tension of the liquid (A) and the influences of the degree of freedom in the surface fluctuation of the liquid (A). It goes without saying, however, that a flat crystalline plane may be formed when an organic semiconductor material with a high crystal forming capability is used.

In the semiconductor element of the invention, the frame and the semiconductor layer may be either in contact or out of contact with each other.

The semiconductor element of the invention may be a FET. In this case, the semiconductor element includes a gate electrode to apply an electric field to a semiconductor layer, a gate insulating film disposed between the semiconductor layer and the gate electrode, and a source electrode and a drain electrode both in contact with the semiconductor layer. Alternatively, as has been described, the semiconductor element of the invention may be a semiconductor element other than a FET.

Electronic Device and Manufacturing Method of the Same

An electronic device of the invention is provided with the semiconductor element of the invention. The electronic device, however, may be provided with a semiconductor element other than the semiconductor element of the invention. More specifically, in a case where the electronic device is provided with more than one semiconductor element, it is sufficient that at least one of the semiconductor elements is the semiconductor element of the invention.

A method of the invention for manufacturing an electronic device provided with the semiconductor element includes a step of manufacturing the semiconductor element by the method of the invention for manufacturing a semiconductor element. As has been described above, the semiconductor element is provided with a semiconductor layer containing a crystal of the organic semiconductor material. Steps other than those included in the manufacturing method of the semiconductor element are not particularly limited, and known steps are applicable. The electronic device of the invention can be manufactured by the manufacturing method of the invention.

The electronic device of the invention is not particularly limited. Examples of the electronic device of the invention include a display, a radio frequency identification tag, an optical sensor, an image sensor, a gas sensor, a pressure sensor, a laser element, an optical switching element, an electroluminescent device, a liquid crystal backlight, and a liquid crystal display device. Owing to the advantage that the semiconductor element can be formed on a flexible substrate, the invention suitably is applied, in particular, to a flexible display, a radio frequency identification tag, various types of sensors, illumination, an electronic advertisement device with a curved surface or of a hanging display type or in a poster format, a mobile device, a wearable device, an electrical component, a disposable product, an electronic paper, an electronic mall, and an electronic lighting device.

First Embodiment

Hereinafter, one example of a FET of the invention will be described. FIG. 1A is a top view of a FET of a first embodiment and FIG. 1B shows an end view taken on dashed line IB-IB of FIG. 1A. Hereinafter, letters A, C, and E attached to the drawing number indicate that the drawing of interest is a top view and letters B, D, and F attached to the drawing number indicate that the drawing of interest is an end view taken on dashed line of the corresponding top view.

A FET 10 shown in FIGS. 1A and 1B includes a substrate 11 (base), a frame 12, a crystal 13, a source electrode 14, a drain electrode 15, a gate insulating film 16, and a gate electrode 17.

The substrate 11 is, for example, a silicon substrate or a glass substrate. The frame 12 is a self-assembled film made using $CF_3(CF_2)_7(CH_2)_2SiCl_3$, which is a silane coupling agent available from Shin-Etsu Chemical Co., Ltd. The self-assembled film bonds to the substrate 11 by siloxane bonding. The self-assembled film is resistant to an organic solvent and water and also withstands heat up to 300° C. The surface of the self-assembled film is hydrophobic owing to a fluorocarbon group.

The frame 12 is a square frame. The height of the frame 12 is about 1 nm. The size of the outer edge of the frame 12 is, for example, 1 mm long and about 1 mm wide. The width (width of one side) of the frame 12 is about 10 µm.

The crystal 13 is made of rubrene. Instead of rubrene, other semiconductor materials, for example, the other semiconductor materials specified above, may be used. It should be noted that a semiconductor layer containing the crystal 13 in part may be used instead of the crystal 13 as long as the effects of the invention can be achieved (the same can be said in embodiments below). The source electrode 14 and the drain electrode 15 can be made of a metal material such as copper, aluminum, nickel, cobalt, platinum, gold, silver, molybdenum, tantalum, or alloy containing the foregoing metals. These electrodes, however, may be formed using other materials. For example, a conductive oxide material (such as indium tin oxide (ITO), fluorine-doped tin oxide (FTO), tin oxide ($SnO_2$), indium oxide (IO) and molybdenum oxide) can be used instead. Further, a conductive polymer material (polyacetylene, polydiacetylene, polypyrrole, polythiophene, polyaniline, poly(p-phenylene), poly(p-phenylenevinylene), polyfluorene, polycarbazole, polysilane, and so forth), a carbon material (carbon black, graphite, fullerene, a carbon nanotube, a spiral carbon material, a carbon resin material, and so forth) may be used as well. In addition, a composite material or a mixed material of two or more of the foregoing materials is also available.

The gate insulating film 16 is made of polyimide (available from KYOCERA Chemical Corporation). The gate electrode 17 is made of gold.

The gate insulating film may be formed using an insulating material other than polyimide. For example, polystyrene, polyamide imide, poly(vinyl phenylene), polycarbonate (PC), acrylic resin (polymethyl methacrylate and the like), fluorine resin (polytetrafluoroethylene and the like), phenol rein (poly(vinyl phenol), novolac resin, and so forth), olefin resin (polyethylene, polypropylene, polyisobutylene, polybutene, and so forth) may be used instead. Further, two or more of the foregoing materials may be combined. Alternatively, an inorganic material (for example, a $SiO_2$ film) may be used. A $SiO_2$ film can be formed, for example, by depositing a film by coating a solution of polysilicate, polysiloxane, or polysilazane, followed by heating the resulting film in the presence of an oxygen gas or steam. Furthermore, it is also possible to form an inorganic gate insulating film by depositing a film by coating a solution of metal alkoxide followed by heating the film in oxygen atmosphere.

The gate electrode may be formed using a conductive material other than gold. For example, metal such as silver, nickel, copper, platinum, aluminum, titanium, tantalum, cobalt and molybdenum and alloy containing the foregoing metals; alkaline metal such as lithium, sodium, potassium and cesium; alkaline earth metal such as magnesium, calcium and strontium; and rare-earth metal such as lanthanum, Ce, Pr, Nd, Sm, Eu, Gd, Tb, Dy, Ho, Er, Tm and Yb may be used instead. Fluoride (halide) such as LiF and CsF containing the foregoing metals may be used as well. Further, a semiconductor such as n-type silicon or gallium arsenide may be used. Regarding metals that readily react with the oxygen in air, such metals may be used in the form of alloy with more stable metals such as silver, gold, nickel and copper. Alternatively, a conductive oxide material such as indium tin oxide (ITO), fluorine-doped tin oxide (FTO), tin oxide ($SnO_2$), indium oxide (IO), and molybdenum oxide may be used instead. Further, a conductive polymer material (polyacetylene, polydiacetylene, polypyrrole, polythiophene, polyaniline, poly(p-phenylene), poly(p-phenylenevinylene), polyfluorene, polycarbazole, polysilane, and so forth), a carbon material (carbon black, graphite, fullerene, carbon nanotube, a carbon helical material, a carbon resin material, and so forth) may be used as well. A composite material or a mixed material of two or more of the foregoing materials is also available.

FIGS. 1A and 1B show an example of the semiconductor element in which a clearance is present between the frame 12 and the crystal 13. In the manufacturing method of the first embodiment, the liquid medium normally evaporates from the liquid (A) containing the organic semiconductor material and a crystal is eventually formed while the solute changes its state to a saturated state or an oversaturated state. The volume of the crystal 13 is therefore smaller than an amount of the liquid (A) placed inside the frame 12. The crystal 13 is thus formed inside the frame 12 only in part. The crystal 13, however, can be formed entirely inside the frame 12 depending on the conditions. For example, by adding the liquid (A) in an amount same as an amount of the evaporated liquid medium, it is possible to form the crystal 13 entirely inside the frame 12.

Hereinafter, one example of the manufacturing method of the FET 10 will be described. Initially, as shown in FIGS. 2A and 2B, the source electrode 14 and the drain electrode 15 are formed in the surface of the substrate 11, and the frame 12 is then formed on the substrate 11. The source electrode 14 and the drain electrode 15 can be formed by means of vapor deposition.

A method of forming the frame 12 is shown in FIGS. 3A through 3F. Initially, as shown in FIGS. 3A and 3B, a self-assembled film 12a is formed using $CF_3(CF_2)_7(CH_2)_2SiCl_3$ so as to cover the substrate 11, the source electrode 14 and the drain electrode 15. The self-assembled film 12a can be formed by coating a solution of $CF_3(CF_2)_7(CH_2)_2SiCl_3$ followed by drying. A solvent for the solution can be, for example, perfluoroether (available from 3M).

Subsequently, as shown in FIGS. 3C and 3D, a UV ray is irradiated to the self-assembled film 12a while a metal mask 31 is deposited on the self-assembled film 12a in order to protect a portion that ultimately becomes the frame 12. The self-assembled film 12a thus decomposes in a portion unprotected by the metal mask 31. The decomposed self-assembled film turns into a gas and thereby is removed. In this manner, the frame 12 can be formed as shown in FIGS. 3E and 3F.

The frame formed of the self-assembled film may be provided by any other known method. For example, the self-assembled film may be patterned by irradiating an electron beam to the self-assembled film. Such a method is disclosed, for example, in the article, Norishita Mino et al, "Fabrication of self-assembled monolayer patterns by selective electron beam irradiation and a chemical adsorption technique", *Thin Solid Films*, Volume 243, Issues 1-2, 1 May, 1994, pages 374-377. Alternatively, the frame may be provided by a method wherein a resist pattern is formed in regions except for the portion where the frame is to be formed, and the self-assembled film is formed so as to cover the resist pattern, after which the resist pattern is removed.

Then, as shown in FIGS. 2C and 2D, the inside of the frame 12 is filled with a solution 21 obtained by dissolving rubrene in 1,2,4-trichlorobenzene. The solution 21 can be supplied inside the frame 12 by using a printer head used in an ink-jet printer or a dispenser. In particular, the ink-jet method has an advantage in its ability to control an amount of liquid and is therefore one of preferable techniques. The substrate 11 filled with the solution 21 is allowed to stand in an environment suitable to crystal formation. For example, the substrate is set in a vessel in which the temperature, the gas atmosphere, and so forth are under control. Then, the concentration of the solution is controlled by controlling a volume of volatilization of the solvent in each set time to adjust the conditions to be most suitable to crystal formation and growth. In this manner, a seed crystal is formed in the solution 21 and the crystal growth is accelerated by using the seed crystal as a nucleus. Methods other than the ink-jet method and the dispenser method may be used as the method of placing the solution 21 inside the frame 12. For example, the base on which the frame 12 is formed may be immersed in the solution 21. Alternatively, the solution 21 may be sprayed to the base on which the frame 12 is formed.

Conditions of the crystal formation vary with types of crystal. By way of example, descriptions will be given to a case where a crystal is formed using a brown solution at a concentration of 10 g/L obtained by dissolving rubrene (available from Aldrich) into 1,2,4-trichlorobenzene (available from Aldrich) at 60° C. used as a solvent. After 500 microliters of this solution is dropped inside the frame 12 by using a dispenser, the substrate 11 is placed in nitrogen gas atmosphere at 150° C. while the entire substrate 11 is vibrated once in every ten minutes. Under these circumstances, a seed crystal is formed within about 24 hours. A crystal can be formed on the substrate by subsequently performing an operation to lower the atmosphere temperature from 150° C. to room temperature at a rate of about 1° C. per hour.

In this manner, as shown in FIGS. 2E and 2F, the crystal 13 is formed inside the frame 12. The size of the crystal 13 is, for example, 250 μm in length, 300 μm in width, and 10 μm in height. Besides changing temperature atmosphere and gas atmosphere, a pressure may further be changed for the crystal formation. In addition, the frame 12 may be removed after the crystal 13 is formed. In a case where the size of the crystal 13 obtained by a single crystal formation is too small, placement of the liquid (A) and the crystal formation may be repeated more than once.

Subsequently, the gate insulating film 16 and the gate electrode 17 are formed. The FET 10 shown in FIGS. 1A and 1B thus is completed. The gate insulating film 16 and the gate electrode 17 can be formed by any known method. For example, the gate insulating film 16 can be formed by means of spin coating and the gate electrode 17 can be formed by means of vapor deposition.

The layout of the respective portions forming the element is not particularly limited as long as the element is able to function as a FET (the same can be said in embodiments below). For example, the gate insulating film 16 and the gate electrode 17 may be disposed between the base (the substrate 11) and the semiconductor layer (the crystal 13) as with the source electrode 14 and the drain electrode 15. In this case, the gate electrode 17, the gate insulating film 16, and the crystal 13 are stacked sequentially in this order on the substrate 11. Alternatively, the source electrode 14 and the drain electrode 15 may be formed on the crystal 13. Further, the FET may be formed in the thickness direction.

Figures 1C, 1D:
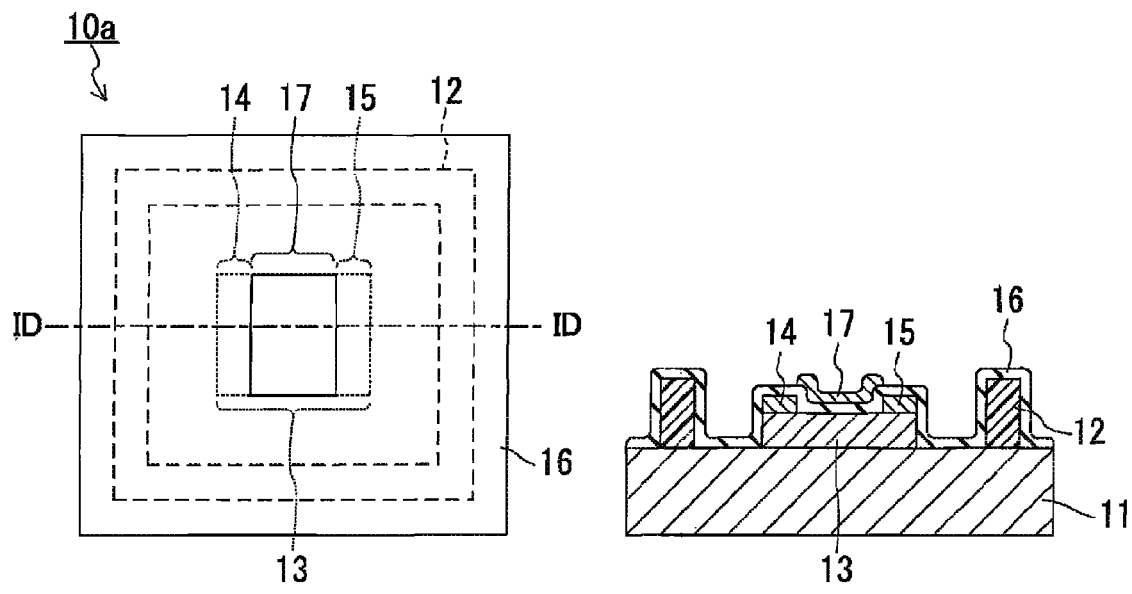
FIGS. 1C and 1D are respectively a top view and an end view showing another example.

FIGS. 1C and 1D show one example of a FET in which the source electrode 14 and the drain electrode 15 are formed on the crystal 13. In a FET 10a shown in FIGS. 1C and 1D, the crystal 13 is formed on the substrate 11, and the source electrode 14 and the drain electrode 15 are formed on the crystal 13. The gate insulating film 16 is formed so as to cover the crystal 13, the source electrode 14, and the drain electrode 15. The gate electrode 17 is formed on the gate insulating film 16 in a region between the source electrode 14 and the drain electrode 15. An insulating base layer may be disposed between the crystal 13 and the substrate 11. In a case where the crystal 13 is directly formed on the substrate 11, the substrate 11 is normally made of an insulating material.

The crystal 13 in the FET 10a can be formed by the same method as the counterpart in the FET 10. After the crystal 13 is formed, the source electrode 14, the drain electrode 15, the gate insulating film 16, and the gate electrode 17 are formed sequentially in this order. These components can be formed by a technique typically used in the semiconductor element fabrication process.

In a case where the frame is formed using a silane coupling agent, it is preferable that active hydrogen (for example, a hydroxyl group or a carboxyl group) exists in the substrate surface on which the frame is formed. Active hydrogen is thought to be present on the substrate surface in the case of a substrate made of an oxide such as ceramics. Also, in the case of a substrate made of metal, in general, active hydrogen is often present on the surface due to a natural oxide film that is formed on the surface. In a case where only a minor amount of active hydrogen is present, active hydrogen can be formed on the surface by oxidation of the surface or the like. In the case of a substrate made of resin, it is generally rare for active hydrogen (for example, a hydroxyl group, a carboxyl group, an amino group, an imino group, or a mercapto group) to be present on the surface. It is therefore often difficult to apply a silane coupling agent. Nevertheless, active hydrogen can be formed on the surface by a physical surface treatment such as a UV ozone surface treatment, an oxygen plasma treatment, a glow discharge treatment and a corona discharge treatment. Further, active hydrogen can be formed on the surface by a chemical oxidation treatment.

Second Embodiment

A second embodiment will describe another example of the method for forming a crystal. Embodiments below will describe the method for forming a crystal alone, and the same configurations and the methods as those of the FET 10 or the FET 10a in the first embodiment above are applicable to the other portions.

In the method of the second embodiment, the bottom surface enclosed by the frame is formed as a surface having high wettability with the liquid (A). To be more concrete, as shown in FIGS. 4A and 4B, a coating layer 42 having high wettability with the liquid (A) is formed inside the frame 12. The coating layer 42 therefore forms the bottom surface enclosed by the frame 12. Alternatively, it may be configured in such a manner that the coating layer 42 is formed across the entire surface of the base (substrate 11) and the frame 12 is formed thereon (the same can be said with the coating layers in embodiments below). Further, instead of forming the coating layer 42, the lyophilic treatment may be applied to the surface of the substrate 11.

The coating layer 42 can be formed, for example, by dropping a solution containing a material of the coating layer 42 inside the frame 12 followed by causing the solvent to evaporate. A material of the coating layer 42 is selected according to the type of the liquid (A). For example, in a case where the liquid (A) is a 1,2,4-trichlorobenzene solution of rubrene used in the first embodiment above by way of example, it is thought that a material containing an aromatic ring or a chloromethyl group is suitable as a material of the coating layer 42. The coating layer 42 can be formed, for example, using $CH_2ClCH_2CH_2SiCl_3$ (available from AZmax Corporation), which is a silane coupling agent. By dropping the solution 21 (a 1,2,4-trichlorobenzene solution of rubrene) on the coating layer 42, the solution 21 eventually spreads uniformly inside the frame 12.

After the coating layer 42 is formed, a FET can be fabricated in the same sequence as the FET 10a of the first embodiment above. In a case where the coating layer 42 is used, because the solution 21 fully spreads inside the frame 12, the crystal 13 possibly may be formed across the entire bottom surface of the frame 12. FIGS. 4C and 4D show the crystal 13 formed in such a case. In a case where the crystal 13 as is shown in FIGS. 4C and 4D is to be formed, the crystal forming step is performed more than once as needed.

In the second embodiment, a semiconductor layer was also formed more than once without using the frame 12. Consequently, the semiconductor layers were formed over a wide range about the coating layer 42. The semiconductor layer covered the coating layer 42 completely in some cases, and the semiconductor layer covered the coating layer 42 only in part in other cases. The coating layer 42, however, was never covered with the semiconductor layer with satisfactory reproducibility. In addition, the semiconductor layer became thinner with an increase of the area of the semiconductor layer, whereas the semiconductor layer became thicker with a decrease of the area of the semiconductor layer. The thickness of the semiconductor layer therefore varied considerably. As has been described, in the absence of the frame, it was difficult to form the semiconductor layer at a predetermined position in a specific thickness.

Third Embodiment

Figure 5A:
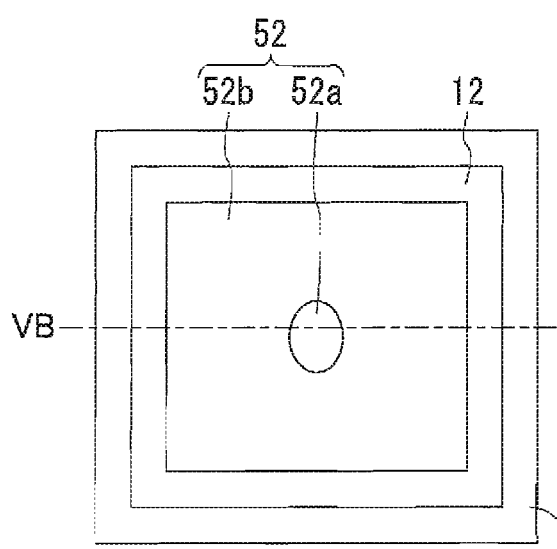
FIGS. 5A and 5B are respectively a top view and an end view showing still another step in the method of the invention for fabricating a FET.
Figure 5B:
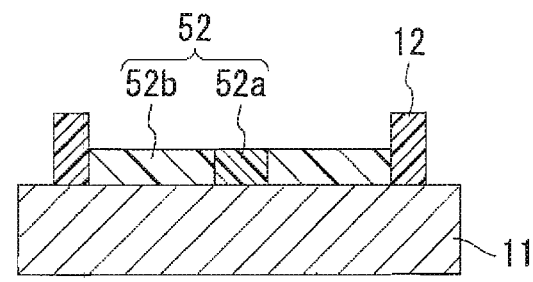

A third embodiment will describe a case where a first region and a second region having higher affinity for the liquid (A) than the first region are present in the bottom surface enclosed by the frame. To be more concrete, as shown in FIGS. 5A and 5B, a coating layer 52 is formed inside the frame 12. The bottom surface enclosed by the frame 12 is therefore formed of the coating layer 52.

The coating layer 52 is formed of a coating layer 52a (second region) and another coating layer 52b (first region) disposed on the periphery of the coating layer 52a. The coating layer 52a is formed in a region between where the source electrode 14 and the drain electrode 15 are to be disposed. The coating layer 52a is a film having high wettability with the liquid (A). On the contrary, the coating layer 52b is a film having liquid repellency with respect to the liquid (A).

Materials of the coating layer 52a and the coating layer 52b are selected according to the liquid (A). One example of these materials can be a silane coupling agent. One example of the coating layer 52b having liquid repellency is a fluorocarbon silane coupling agent. For example, in a case where the liquid (A) is the solution 21 (a 1,2,4-trichlorobenzene solution of rubrene) used in the first embodiment above by way of example, it is thought that materials having a hydrocarbon group, a $CFH_2$ group, a $CF_2H$ group, a $CF_3CH_2$ group, or the like as a functional group are suitable materials of the coating layer 52b having liquid repellency. Also, in a case where the liquid (A) is the solution 21 used in the first embodiment above by way of example, the materials described above for the coating layer 42 are suitable materials of the coating layer 52a having a lyophilic property.

In one example, the coating layer 52a may be formed using $CH_2ClCH_2CH_2SiCl_3$ (available from AZmax Corporation) while the coating layer 52b may be formed using $CH_2FCH_2CH_2SiCl_3$ (available from AZmax Corporation). When the solution 21 (a 1,2,4-trichlorobenzene solution of rubrene) is dropped on the coating layer 52 formed as above, the solution 21 is placed in a state where it is in contact with the portion formed of the coating layer 52b while it is repelled almost completely in the other portions.

The coating layers 52a and 52b can be formed, for example, by a method as follows. Initially, a region where the coating layer 52b is to be formed is covered with a pattern of positive resist. Subsequently, the coating layer 52a is formed by treating a region where the coating layer 52a is to be formed with a solution containing the material of the coating layer 52a. The positive resist pattern then is removed so as to expose the base in the region where the coating layer 52b is to be formed. Subsequently, the coating layer 52b is formed on the exposed region by treating this region with a solution containing the material of the coating layer 52b. In this instance, because the base is not exposed in the region of the coating layer 52a and this region is covered with the coating layer 52a, the coating layer 52b is formed only in the portion where the base is exposed. The coating layers may be formed in reverse order.

It is also possible to form the coating layer 52 without using the resist pattern. For example, the coating layer 52a is formed first across the entire surface in the region where the coating layer 52 is to be formed. Subsequently, the coating layer 52a is removed from the region where the coating layer 52b is to be formed by means of photodecomposition, UV oxidation or the like using a mask, thereby exposing the base in the region. The coating layer 52b then is formed in the region thus exposed. In this case, too, the forming order of the coating layers can be reversed by forming the coating layer 52a after the coating layer 52b is formed.

In a case where the substrate 11 is inclined or vibrated during the crystal formation, the liquid (A) constantly moves inside the frame 12, which possibly gives rise to a problem in the crystal growth. In contrast, in a case where the coating layer 52 is used, it is possible to suppress the move of the liquid (A) with the lyophilic coating layer 52a. It is therefore possible to form the crystal 13 selectively in the vicinity of the coating layer 52a.

In a case where wettability with the liquid (A) is high on the surface of the substrate 11, the same effect can be obtained in some cases by configuring in such a manner that the substrate 11 is exposed only in a portion where the coating layer 52a is supposed to be formed instead of forming the coating layer 52a. In addition, more than one lyophilic second region may be formed inside a single frame 12.

After the step of FIGS. 5A and 5B, a FET can be fabricated by the same sequence as the FET 10a of the first embodiment above.

Fourth Embodiment

Figure 6A:
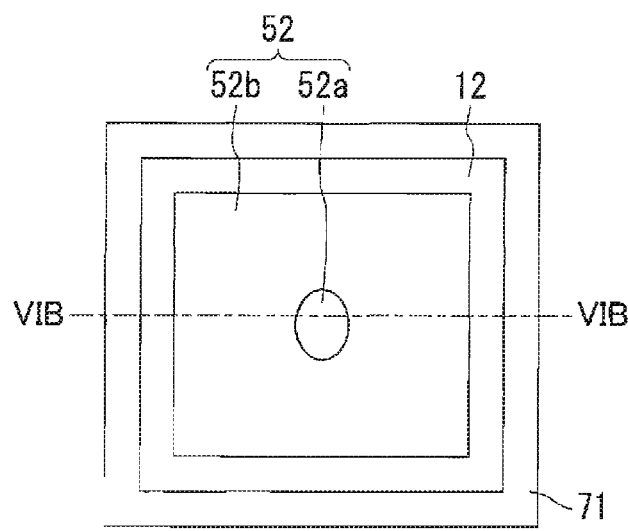
FIGS. 6A and 6B are respectively a top view and an end view showing still another step in the method of the invention for fabricating a FET.
Figure 6B:
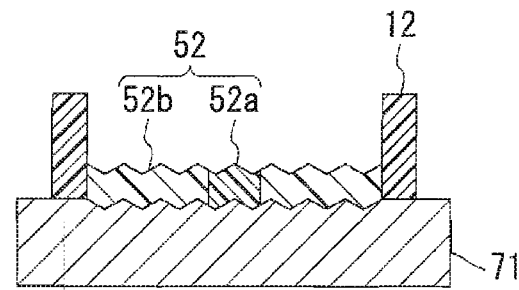

A fourth embodiment will describe a case where a first region and a second region having higher affinity for the liquid (A) than the first region are present in the bottom surface enclosed by the frame. In the fourth embodiment, as shown in FIGS. 6A and 6B, the coating layer 52 is formed on a substrate 71.

The coating layer 52 is formed of the coating layers 52a and 52b in the same way as those used in the third embodiment above. The substrate 71 is, for example, a silicon substrate. Of the surface of the substrate 71, at least a part of the surface on which to form the coating layer 52b is made rough. To be more concrete, concavo-convex irregularities of 1 μm or less are formed on this part of the surface. By forming the liquid-repellent coating layer 52b on the roughened surface, it becomes possible further to increase liquid repellency of the coating layer 52b.

Of the surface of the substrate 71, only a part of the surface on which to form the coating layer 52 may be made rough or the entire surface of the substrate 71 may be made rough. Further, it may be configured in such a manner that a substrate with no roughened surface is used and a film with a roughed surface is formed between the substrate and the coating layer 52 instead. The surface of the substrate and the surface of the film can be made rough by known physical treatments or known chemical treatments. By roughening the surfaces of the substrate and/or the film, not only can liquid repellency be increased, but also the generation of a crystal nucleus can be accelerated.

According to the configuration of the fourth embodiment, there is a risk that the liquid (A) is spilled out from the frame 12 when the height of the frame 12 is about 1 to 2 nm. In such a case, it is necessary to form a frame high enough to serve as a physical barrier. In a case where the frame 12 having a height, for example, of 1 μm or higher is formed, a resist film employed in the semiconductor element fabrication process may be used. A high frame 12 can be formed readily by patterning the resist film by a known technique.

In the fourth embodiment, as with the third embodiment above, the coating layer 52 formed of the lyophilic coating layer 52a and the liquid-repellent coating layer 52b is used. The configuration of the coating layer 52 and variations thereof are the same as those of the counterpart in the third embodiment above. When the solution 21 (a 1,2,4-trichlorobenzene solution of rubrene) is dropped on the coating layer 52 formed as above, the solution 21 is placed in a state where it is in contact with the portion formed of the coating layer 52a while it is repelled almost completely in the other portions.

After the step of FIGS. 6A and 6B, a FET can be fabricated by the same sequence as the FET 10a of the first embodiment above.

Fifth Embodiment

Figures 7A, 7B:
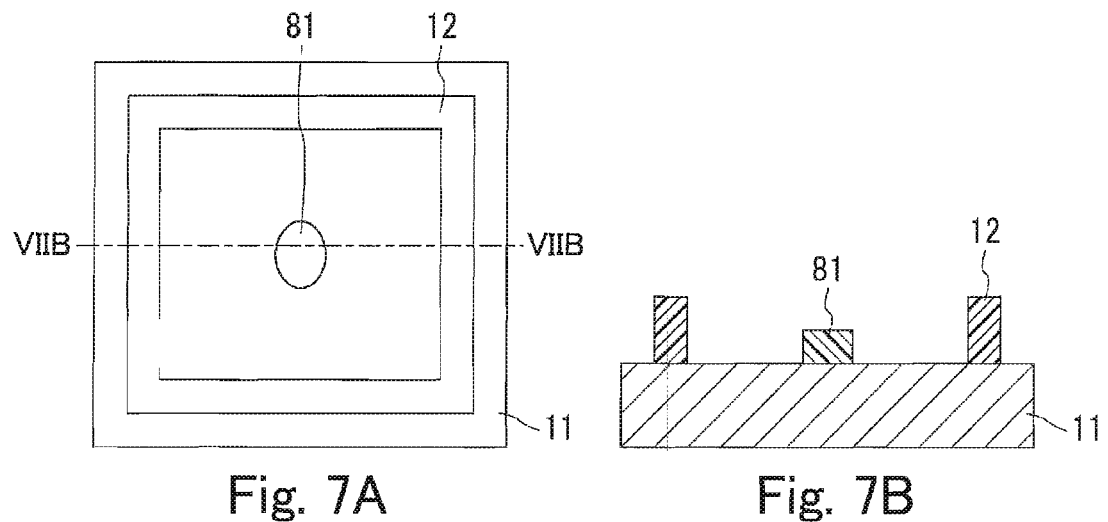
FIGS. 7A and 7B are respectively a top view and an end view showing still another step in the method of the invention for fabricating a FET.

A fifth embodiment will describe a case where a substance that induces the formation of a seed crystal is placed inside the frame 12. To be more concrete, as shown in FIGS. 7A and 7B, a film 81 is formed on the substrate 11. As shown in FIGS. 1A and 1B, the source electrode 14 and the drain electrode 15 may be formed on the surface of the substrate 11.

The film 81 is a film that induces the formation of a seed crystal of the crystal 13. The configuration and a material of the film 81 are therefore selected according to the types of the liquid (A) and the crystal 13. In a case where the solution 21 (a 1,2,4-trichlorobenzene solution of rubrene) described in the first embodiment above is used as the liquid (A), for example, a self-assembled film made of an organic molecule having a rubrene skeleton may be used as the film 81. The formation of a seed crystal of rubrene can be accelerated using the film 81 formed as above. Also, it is possible to form the crystal in the vicinity of the film 81.

A region where the film 81 is to be disposed and the number of the film 81 can be changed as needed, and for example, more than one film 81 can be disposed inside the frame 12. Alternatively, a seed crystal may be placed instead of the film 81. The film 81 and the seed crystal are one configuration of a region having a high lyophilic property.

Examples of an organic molecule that can be used to form the film 81 include 9-[4-{2-(trichlorosilyl)ethyl}phenyl]anthracene, 4-phenyl-1-[4-{2-trichlorosilyl)ethyl}phenyl]naphthalene, 1,4-bis[4-{2-trichlorosilyl)ethyl}phenyl]naphthalene, 10-phenyl-9-[4-{2-(trichlorosilyl)ethyl}phenyl]anthracene, 9,10-bis[4-{2-trichlorosilyl)ethyl}phenyl]anthracene, and 5,6,11-triphenyl-12-[4-{2-(trichlorosilyl)ethyl}phenyl]tetracene. Each organic molecule contains a trichlorosilyl group. However, another functional group that bonds to the base may be used instead of a trichlorosilyl group. Examples of such a functional group include an alkoxysilyl group such as a monochlorosilyl group, a dichlorosilyl group, a methoxy group and an ethoxy group. In a case where the film 81 is to be formed using the foregoing molecules, a resist film and photolithography can be used. The film 81 may be formed of several tens of molecules. Alternatively, a single organic molecule may be used instead of the film 81.

In a case where the organic semiconductor material is anthracene or rubrene, 9-[4-{2-(trichlorosilyl)ethyl}phenyl]anthracene, 10-phenyl-9-[4-{2-(trichlorosilyl)ethyl}phenyl]anthracene, or 9,10-bis[4-{2-(trichlorosilyl)ethyl}phenyl]anthracene is used preferably as a material of the film 81. In a case where the organic semiconductor material is naphthalene or rubrene, 4-phenyl-1-[4-{2-(trichlorosilyl)ethyl}phenyl]naphthalene and 1,4-bis[4-{2-(trichlorosilyl)ethyl}phenyl]naphthalene are used preferably as a material of the film 81. In a case where the organic semiconductor material is tetracene or rubrene, 5,6,11-triphenyl-12-[4-{2-(trichlorosilyl)ethyl}phenyl]tetracene is used preferably as a material of the film 81.

The compounds specified above as the examples of a material of the film 81 can be synthesized by known methods. As one example, a synthesis method of 10-phenyl-9-[4-{2-trichlorosilyl)ethyl}phenyl]anthracene will be described in the following.

Initially, 9.2 g of 9-phenyl anthracene and 215 mL of dehydrated dichloromethane are placed in a reaction vessel under an argon air flow and 6.3 g of bromine is dropped in the reaction vessel. A reaction solution is then kept stirred for two hours at room temperature. Subsequently, the reaction solution is rinsed with an aqueous solution of sodium thiosulfate (concentration: 5%) so as to separate an organic layer. The organic layer is rinsed with water and dehydrated with anhydrous magnesium sulfate and is further subjected to vacuum concentration. The organic layer then is purified further using a silica gel column. In this manner, 10.7 g of 10-phenyl-9-bromine-anthracene (compound 1) is obtained. The product is identified by the nuclear magnetic resonance absorption spectrum.

Subsequently, 10.4 g of the compound 1, 4.84 g of 4-vinyl phenyl boronic acid, 1080 mg of tetrakis(triphenylphosphine) palladium, 940 ml of tetrahydrofuran, and 520 ml of an aqueous solution of 1M-potassium carbonate are placed in a reaction vessel under an argon air flow. The reaction solution then is kept under reflux for 21 hours at 66 degrees. The reaction solution then is allowed to stand for natural heat release to room temperature. Subsequently, the product is extracted using ethyl acetate and rinsed with water. The product is further dehydrated with anhydrous sodium sulfate. The product is then subjected to vacuum concentration and further purified using a silica gel column. In this manner, 6.8 g of 10-phenyl-9-(4-vinylbenzene) (compound 2) is obtained. The product is identified by the nuclear magnetic resonance absorption spectrum.

Subsequently, 1.67 g of the compound 2, 33 ml of dehydrated dichloromethane, and 0.86 g of trichlorosilane are placed in a pressure-resistant glass reaction vessel. Further, 9.4 μL of a tetrahydrofuran solution of hexachloroplatinic acid hexahydrate (at the concentration of 10%) is added in the reaction vessel at room temperature. Trichlorosilane and a tetrahydrofuran solution of hexachloroplatinic acid hexahydrate are added in two times. The reaction solution then is kept stirred for two days. Subsequently, the product is subjected to vacuum concentration and is further purified by sublimation. In this manner, 0.6 g of 10-phenyl-9-[4-{2-(trichlorosilyl)ethyl}phenyl]anthracene is obtained. The product is identified by the nuclear magnetic resonance absorption spectrum.

In the manufacturing method of the invention, an operation to induce the formation of a seed crystal in the liquid (A) may be performed. For example, by irradiating light (such as a laser beam) to a part of the liquid (A) to instantaneously raise the temperature of the irradiated portion, it is possible to form a seed crystal in this portion.

After the step of FIGS. 7A and 7B, a FET can be fabricated by the same sequence as the FET 10 or the FET 10a of the first embodiment above.

Other Variations

Some of the embodiments above described the method of controlling the formation position of the crystal by using the bottom surface whose wettability with the liquid (A) is controlled. In the manufacturing method of the invention, however, the formation position of the crystal may be controlled by using the frame whose wettability with the liquid (A) is controlled.

Figures 8A, 8B:
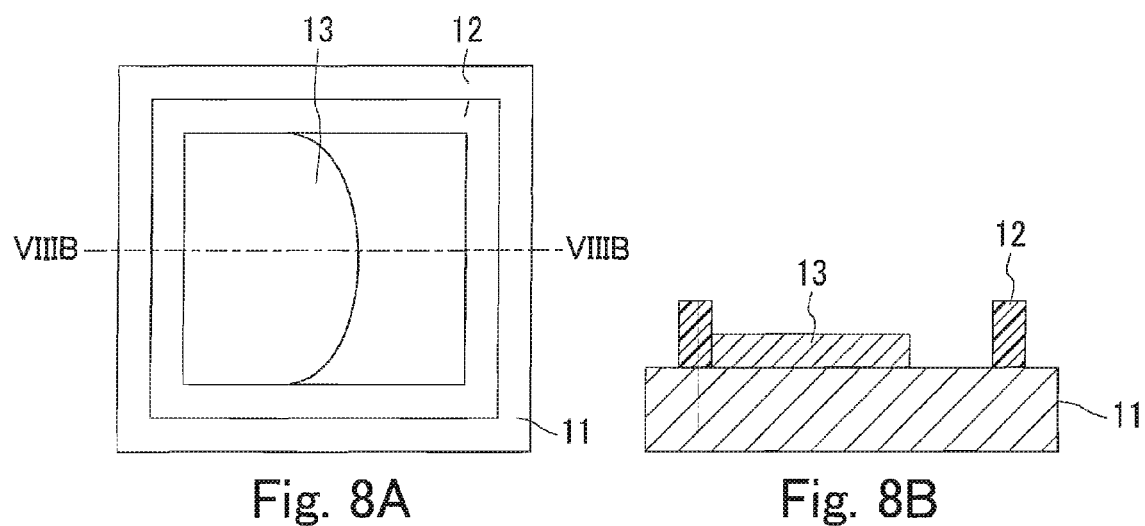
FIGS. 8A and 8B are respectively a top view and an end view showing still another step in the method of the invention for fabricating a FET.

For example, it may be configured in such a manner that wettability is increased on the inner surface of a single side among the four sides forming a square ring-shaped frame and wettability is decreased on the inner surfaces of the other sides. When configured in this manner, as shown in FIGS. 8A and 8B, it becomes possible to form the crystal 13 so as to be in contact with the inner surface of the side having higher wettability with the liquid (A) among the sides forming the frame 12. Alternatively, a seed crystal or a substance that induces the formation of a seed crystal may be placed on the inner surface of a specific side of the frame.

The embodiments above have described a case where rubrene is used as the crystal material. However, other crystalline substances may be used instead. For example, a crystal of pentacene can be formed in the same manner as the first embodiment above using 1,2,4-trichlorobenzene as a solvent. The liquid (A) in this case can be formed by dissolving pentacene in 1,2,4-trichlorobenzene to have a concentration of 1.46 g/L. The seed crystal can be formed, for example, at 200° C.

In addition, in the embodiments above, the film 81 or a seed crystal may be provided in the vicinity of the frame or in contact with the frame as needed. In this case, a crystal with an aligned crystalline orientation often can be obtained.

In order to confirm the quality of the obtained crystals, the crystals were measured by the X-ray diffraction method and the crystalline property was evaluated on the basis of the value of a full width at half-maximum at the diffraction peak. Herein, a Cuk α beam was used as the X-ray source and a Cuk α beams was generated at 30 kV and 10 mA. There was no substantial difference of FWHM between rubrene crystals and pentacene crystals formed by the method of the invention. Differences of FWHM between these crystals were in a range of 50 seconds to 15 seconds (one second=1° of 3600 minutes) and most of the differences were 40 seconds.

The embodiments above described a FET in which a source-drain current flows in a direction parallel to the substrate surface. A FET of the invention, however, can be a FET of the longitudinal structure, that is, a FET in which a source-drain current flows in a direction perpendicular to the substrate surface. In a FET of the longitudinal structure, not only the semiconductor layer but also the electrodes can be formed using the frame. In this case, the electrodes may be formed by a method of dropping a electrode material in the form of a liquid or powder inside the frame. According to this method, because the electrodes of the same shape as the semiconductor layer can be formed, utilization efficiency of the semiconductor layer can be enhanced. In addition, the gate insulating film can be also formed using the frame. In this case, a liquid material can be used as a material of the gate insulating film. The gate insulating film, the gate electrode, and the semiconductor layer can be formed in the same shape with the use of the frame.

In a case where more than one semiconductor layer is stacked, a plurality of semiconductor layers can be formed in the same shape with the use of the frame. Also, in a case where another layer is stacked on the semiconductor layer, the semiconductor layer and another layer can be formed in the same shape with the use of the frame. An example of another layer can be a monomolecular layer used to control the surface condition of the organic semiconductor layer. Such a monomolecular layer can be formed from a silane coupling material and the like. A further example of another layer is an active layer that is formed using a liquid containing metal oxide such as zinc oxide, titanium oxide, gallium indium zinc oxide and tin-doped indium oxide.

[Solar Cell]

The embodiments above have described a FET. The semiconductor element of the invention, however, can be a solar cell (for example, a dye-sensitized solar cell). Because the characteristic (for example, mobility) of the semiconductor layer can be enhanced, the photoelectric conversion efficiency of a solar cell of the invention is highly likely to be increased. The basic structure of a solar cell is formed by a hetero junction using an n-type organic semiconductor material and a p-type organic semiconductor material (a donor material and an acceptor material). Accordingly, a solar cell can be formed by stacking an n-type organic semiconductor layer and a p-type organic semiconductor layer inside the frame. In order to increase conversion efficiency, a functional layer (for example, a transport layer and a block layer) may be provided in addition to the layers specified above. Examples of an organic semiconductor material used in an organic solar cell include fullerene, a thiophene derivative, copper phthalocyanine, and zinc phthalocyanine.

[Light Emitting Element]

The semiconductor element of the invention may be a light emitting element. In this case, light is emitted by causing an electron and a hole injected from two electrodes to bond within the organic semiconductor layer. Examples of an organic compound that can be used for the organic semiconductor layer in the light emitting element include pentacene, tetracene, a phenylene vinylene derivative, a thiophene derivative, and tetraphenyl pyrene.

[Elements Other Than Semiconductor Element]

It should be appreciated that the invention is applicable to elements other than the semiconductor element. This element includes a base, a frame formed on the base, and a crystal disposed inside the frame. The base and the frame are the same as the base and the frame described above. Also, the method of forming a crystal is the same as the methods described above except that a material of the crystal is not limited to the organic semiconductor material. A material of the crystal may be an organic material or an inorganic material. A liquid containing a material of the crystal is placed inside the frame and the crystal is then formed from the liquid.

A crystal to be formed on the bottom surface enclosed by the frame may be a bulk made of crystals alone or a moiety of a solid including a state other than a crystal. As has been described, the crystal can be a single crystal, a polycrystal, a molecular crystal, or a mixture of the foregoing crystals.

Figures 9A, 9B:
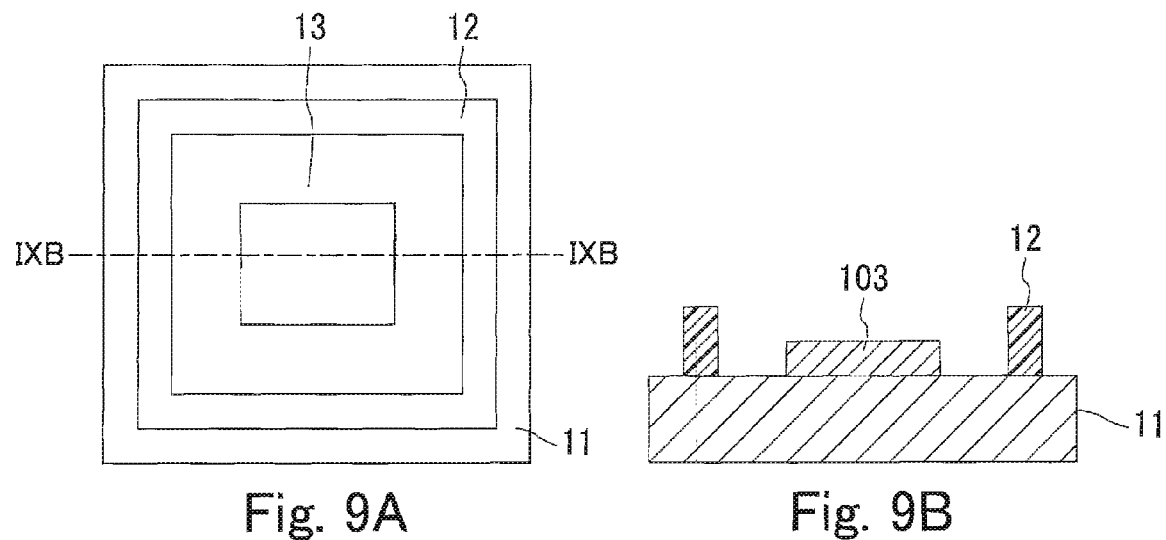
FIGS. 9A and 9B are respectively a top view and an end view showing an example in a case where the invention is applied to an element other than a semiconductor element.

FIGS. 9A and 9B show one example of this element. This element includes a substrate 11 (base), a frame 12 formed on the substrate 11, and a crystal 103 disposed inside the frame 12. The element includes other members as needed.

Various elements can be achieved according to the types of crystal. For example, it is possible to achieve a wavelength conversion element and an optical switching element.

The invention is also applicable to a method for manufacturing these elements. This manufacturing method is a method for manufacturing an element containing a crystal and includes a step (I) of forming a frame on a base, and a step (II) of forming the crystal inside the frame. The step (II) includes a crystal forming step of placing a liquid containing a material of the crystal and a liquid medium inside the frame for the crystal to be formed from the liquid. The steps (I) and (II) can be performed in the same manner as the steps (i) and (ii) above. Hence, except that a material of the crystal is not limited to the organic semiconductor material and the forming members (the electrodes, the insulating film, and so forth) essential for the semiconductor layer can be omitted, the descriptions above can be applied to this method intact. To be more concrete, except that a material of the crystal 13 is different, the same method as the methods shown in FIGS. 1A through 7B is applicable.

An organic compound used as a material of the crystal may be an aromatic hydrocarbon compound, a polycyclic compound (condensed ring compound), a dendrimer, a protein material, or film protein. Further, a pendant compound containing the foregoing compounds as a pendant may be used as a material of the crystal. Such a pendant compound may be an organic polymer. Alternatively, an organic molecule containing a conjugate double bond in the principal chain may be used as a material of the crystal. All of the materials described in *Yuuki Kesshou Zairyou no Saishin Gijyutsu*, published under the editorship of Hachirou Nakanishi by CMC Publishing CO., LTD., in Japan in 2005 are candidates for a material of the crystal.

From another viewpoint, the invention is a method for forming a crystal for analytical use inside the frame using the methods described above and a method for conducting analysis using a crystal for analytic use. These methods are useful, in particular, for analysis on the constituent elements and analysis on the crystal structure.

The present invention may be embodied in other specific forms without departing the spirit and the essential features thereof. The embodiments disclosed in this description are given for illustrative purpose in all respects, and the present invention is not limited thereto. The scope of the present invention is set forth not by the foregoing description but by the scope of the claims attached hereto, and is intended to cover all the modifications within a spirit and scope equivalent to those of the claims.

INDUSTRIAL APPLICABILITY

The invention can be used for a semiconductor element including a crystal made of an organic semiconductor material and a manufacturing method of the semiconductor element. Also, the invention can be used for an electronic device provided with the semiconductor element and a manufacturing method of the electronic device.

The invention claimed is:

1. A manufacturing method of a semiconductor element provided with a semiconductor layer containing a crystal of an organic semiconductor material, comprising the steps of:
   (i) forming a frame on a base; and
   (ii) forming the semiconductor layer inside the frame,
   wherein the step (ii) includes a crystal forming step in which a liquid containing the organic semiconductor material and a liquid medium is placed inside the frame and then the crystal is formed from the liquid, and
   a first region and a second region having higher affinity for the liquid than the first region are present in a bottom surface enclosed by the frame.

2. The manufacturing method according to claim 1, wherein the base is made of resin.

3. The manufacturing method according to claim 1, wherein the crystal accounts for at least 50% by volume of the semiconductor layer.

4. The manufacturing method according to claim 1, wherein an inner volume of the frame is in a range of $7.5 \times 10^{-5}$ μm$^3$ to $3 \times 10^7$ μm$^3$.

5. The manufacturing method according to claim 1, wherein a height of the frame is in a range of 0.1 nm to 10 μm.

6. The manufacturing method according to claim 1, wherein the frame is formed of a self-assembled film.

7. The manufacturing method according to claim 1, wherein the step (i) includes the steps of:

(i-a) forming a resist pattern on the base;
(i-b) forming a self-assembled film so as to cover the resist pattern; and
(i-c) forming the frame formed of the self-assembled film by removing the resist pattern.

8. The manufacturing method according to claim 1, wherein the step (i) includes the steps of:
(i-A) forming a self-assembled film on the base; and
(i-B) forming the frame formed of the self-assembled film by removing a part of the self-assembled film, and
wherein the step (i-B) includes a step of decomposing the part of the self-assembled film by irradiating a UV ray or an electron beam to the part of the self-assembled film.

9. The manufacturing method according to claim 1, wherein the liquid is placed inside the frame by a discharge device in the crystal forming step.

10. The manufacturing method according to claim 1, wherein
the crystal is formed by causing the liquid medium in the liquid to evaporate in the crystal forming step.

11. The manufacturing method according to claim 1, further comprising:
a step of placing a substance inside the frame before the liquid is placed inside the frame, wherein
the substance accelerates formation of the crystal.

12. The manufacturing method according to claim 1, wherein
the crystal forming step includes a step of forming a seed crystal in the liquid by irradiating light to the liquid.

13. The manufacturing method according to claim 1, wherein
affinity of the liquid with a bottom surface enclosed by the frame is higher than affinity of the liquid with the frame.

14. The manufacturing method according to claim 13, wherein
the liquid medium contains water; and
the frame is hydrophobic.

15. The manufacturing method according to claim 1, wherein
a source electrode and a drain electrode are disposed in a part of the inner surface of the frame; and
the second region is present between the source electrode and the drain electrode.

16. The manufacturing method according to claim 1, wherein
the semiconductor element includes a gate electrode to apply a voltage to the semiconductor layer, a gate insulating film disposed between the semiconductor layer and the gate electrode, and a source electrode and a drain electrode both in contact with the semiconductor layer.

17. The manufacturing method according to claim 16, wherein
the source electrode and the drain electrode are stacked on the base with the semiconductor layer in between.

18. The manufacturing method according to claim 1, further comprising:
a step of removing the frame after the step (ii).

19. A manufacturing method of an electronic device provided with a semiconductor element, comprising:
a step of manufacturing the semiconductor element according to claim 1.

20. A semiconductor element manufactured by the manufacturing method according to claim 1.

21. A semiconductor element, including:
a base, a frame disposed on the base, and a semiconductor layer disposed inside the frame, wherein a first region and a second region having higher affinity for a liquid containing a semiconductor material and a liquid medium than the first region are present in a bottom surface enclosed by the frame, and the semiconductor layer contains a crystal of an organic semiconductor material.

22. The semiconductor element according to claim 21, wherein at least a part of the crystal is a single crystal.

23. The semiconductor element according to claim 21, wherein the base is made of resin.

24. The semiconductor element according to claim 21, wherein an inner volume of the frame is in a range of $7.5 \times 10^{-5}$ μm$^3$ to $3 \times 10^7$ μm$^3$.

25. The semiconductor element according to claim 21, wherein a surface of the semiconductor layer on a side opposite to a side of the base is a curved plane.

26. The semiconductor element according to claim 21, further including:

a gate electrode to apply an electric field to the semiconductor layer, a gate insulating film disposed between the semiconductor layer and the gate electrode, and a source electrode and a drain electrode both in contact with the semiconductor layer.

27. An electronic device provided with the semiconductor element according to claim 21.

* * * * *